United States Patent
Mailhe et al.

(10) Patent No.: US 10,061,004 B2
(45) Date of Patent: Aug. 28, 2018

(54) MEMORY EFFICIENCY OF PARALLEL MAGNETIC RESONANCE IMAGING RECONSTRUCTION

(71) Applicant: Siemens Healthcare GmbH, Erlangen (DE)

(72) Inventors: Boris Mailhe, Plainsboro, NJ (US); Qiu Wang, Princeton, NJ (US); Johannes Flake, Princeton, NJ (US); Mariappan S. Nadar, Plainsboro, NJ (US); Laszlo Lazar, Gheorgheni (RO); Yuanhsi Chen, Mt. Laurel, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 874 days.

(21) Appl. No.: 14/573,515

(22) Filed: Dec. 17, 2014

(65) Prior Publication Data
US 2016/0178720 A1 Jun. 23, 2016

(51) Int. Cl.
*G01V 3/00* (2006.01)
*G01R 33/561* (2006.01)
*G01R 33/56* (2006.01)

(52) U.S. Cl.
CPC ...... *G01R 33/5611* (2013.01); *G01R 33/5608* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835
See application file for complete search history.

(56) References Cited

U.S. PATENT DOCUMENTS

| 9,880,247 B2 * | 1/2018 | Muftuler | G01R 33/5611 |
| 2009/0179643 A1 * | 7/2009 | Lin | G01R 33/34084 324/312 |

* cited by examiner

*Primary Examiner* — Tung X Nguyen (57) ABSTRACT

A computer-implemented method for reconstructing magnetic resonance images using a parallel computing platform comprising a host unit and a graphical processing device includes receiving a plurality of coil data sets from a magnetic resonance imaging system, each respective coil data set comprising scanner data and a coil sensitivity map associated with a distinct coil included in the magnetic resonance imaging system. An iterative compressed-sensing reconstruction process is applied to reconstruct an image based on the plurality of coil data sets. Each iteration of the iterative compressed-sensing reconstruction process comprises: individually transferring the plurality of coil data sets from the host unit to the graphical processing device using a plurality of asynchronous data streams, overlapping with transfer of the plurality of coil data sets, optimizing a plurality of data fidelity values on the graphical processing device, each respective data fidelity value corresponding to a distinct coil data set, and computing an estimated image on the graphical processing device based on the plurality of data fidelity values.

20 Claims, 4 Drawing Sheets

MEMORY EFFICIENCY OF PARALLEL MAGNETIC RESONANCE IMAGING RECONSTRUCTION

TECHNOLOGY FIELD

The present invention relates generally to methods, systems, and apparatuses for improving the memory efficiency of parallel MRI reconstruction. The disclosed methods, systems, and apparatuses may be used in, for example, image reconstruction using parallel computing platform and programming models such as, for example, the NVIDIA™ Compute Unified Device Architecture (CUDA).

BACKGROUND

Parallel Magnetic Resonance Imaging (MRI) reconstruction combines the signals of multiple coil elements to reconstruct an image. This technique may be used to improve the signal-to-noise ratio, as well as to accelerate acquisition and reduce scan time. One drawback of Parallel MRI reconstruction is that it can involve large data sets. For example, specific Parallel MRI techniques such as sampling perfection with application-optimized contrasts using different flip-angle evolutions (SPACE) imaging mandate high resolution 3D reconstructions of the order of 306×448×288. Techniques such as compressed-sensing may be used to reduce the size of the data acquired somewhat, but the size of data items such as the coil sensitivity maps still require a great deal of storage availability on the computer performing the reconstruction.

Parallel computing programming platforms offer the potential of reducing reconstruction times. These platforms use parallel hardware such as graphical processing units (GPUs), as well as non-GPU hardware, to execute operations at a speed that is significantly higher than those available on systems without parallel hardware. However, memory is limited on such parallel hardware and, as such, parallel computing programming platforms could not be used for many Parallel MRI applications. Thus, it is desired to create new techniques for Parallel MRI which improve the memory efficiency and allow processing on parallel computing platforms.

SUMMARY

Embodiments of the present invention address and overcome one or more of the above shortcomings and drawbacks, by providing methods, systems, and apparatuses which improve the memory efficiency of parallel MRI reconstruction to allow processing on a parallel computing platform. The techniques described herein include asynchronously streaming coil sensitivity data to the graphical processing device. This allows the transfer of data associated with individual coils to be overlapped with the processing of the coil data on the device. Additionally, application of a primal-dual algorithm (e.g., Chambolle-Pock) is described herein for calculation of a regularization term used during reconstruction. Some embodiments also include a pre-computed Lipschitz value used during reconstruction as an alternative to conventional line search techniques. The various techniques described herein may be used alone or in combination to optimize memory usage during reconstruction.

According to some embodiments, a computer-implemented method for reconstructing magnetic resonance images using a parallel computing platform comprising a host unit and a graphical processing device includes receiving a plurality of coil data sets from a magnetic resonance imaging system, each respective coil data set comprising scanner data and a coil sensitivity map associated with a distinct coil included in the magnetic resonance imaging system. An iterative compressed-sensing reconstruction process is applied to reconstruct an image based on the plurality of coil data sets. Each iteration of the iterative compressed-sensing reconstruction process comprises: individually transferring the plurality of coil data sets from the host unit to the graphical processing device using a plurality of asynchronous data streams, overlapping with transfer of the plurality of coil data sets, optimizing a plurality of data fidelity values on the graphical processing device, each respective data fidelity value corresponding to a distinct coil data set, and computing an estimated image on the graphical processing device based on the plurality of data fidelity values. In some embodiments, a pre-computed estimation of a Lipschitz constant is used to ensure convergence of the iterative compressed-sensing reconstruction process. This pre-computed estimation may be, for example, an analytical upper bound for the Lipschitz constant determined based on one or more sampling patterns.

In some embodiments of the aforementioned method, the iterative compressed-sensing reconstruction process is regularized by an $l_1$ norm of a sparsifying transform applied to the estimated image. Calculation of the $l_1$ norm of the sparsifying transform applied to the estimated image may be performed, for example, using a single wavelet as the sparsifying transform. In one embodiment, a Chambolle-Pock loop is used to minimize the $l_1$ norm of the sparsifying transform applied to the estimated image. In one embodiment, the sparsifying transform is a redundant Haar wavelet transform. This wavelet transform may be computed, for example, by applying a plurality of slices of wavelet filters to the estimated image and each respective slice of resulting wavelet coefficients is individually transferred from the host unit to the graphical processing device during application of the sparsifying transform using a plurality of additional asynchronous data streams.

The parallel computing platform may be configured in a variety of ways to perform the aforementioned method. For example, in some embodiments, each of the plurality of data fidelity values is computed using a distinct processing kernel executing on the graphical processing device.

According to other embodiments, a second computer-implemented method for reconstructing images based on magnetic resonance imaging data using a parallel computing platform comprising a host unit and a graphical processing device includes receiving a plurality of coil data sets from a magnetic resonance imaging system, each respective coil data set comprising scanner data and a coil sensitivity map associated with a distinct coil included in the magnetic resonance imaging system. The plurality of coil data sets is stored at the host unit. An iterative compressed-sensing reconstruction process is applied to reconstruct an image based on the plurality of coil data sets. Each iteration of the iterative compressed-sensing reconstruction process comprises individually transferring the plurality of coil data sets from the host unit to the graphical processing device using a plurality of asynchronous data streams, launching a plurality of first processing kernels on the graphical processing device, each respective processing kernel configured to a optimize data fidelity values based on a respective coil data set included in the plurality of coil data sets, and launching a second processing kernel on the graphical processing device configured to reconstruct the image on the graphical processing device based the data fidelity values calculated by each first processing kernel, wherein reconstruction is regularized by application of an $l_1$ norm of a wavelet transform to the image. In some embodiments, a pre-computed estimation of a Lipschitz constant is used to ensure convergence of the iterative compressed-sensing reconstruction process. This Lipschitz constant may be, for example, an analytical upper bound for the Lipschitz constant determined based on one or more sampling patterns.

The aforementioned second method for reconstructing images based on magnetic resonance imaging data may include various enhancements, features, modifications, or the like. For example, in some embodiments, minimization of the $l_1$ norm of the wavelet transform is performed using a primal-dual algorithm comprising, for example, a loop of Chambolle-Pock operations. In some embodiments, the wavelet transform is a redundant Haar wavelet transform computed, for example, by applying a plurality of slices of wavelet filters to the image. In one embodiment, each respective slice of wavelet coefficients is individually transferred from the host unit to the graphical processing device during minimization of the $l_1$ norm of the wavelet transform using a plurality of additional asynchronous data streams. The application of the plurality of slices of wavelet filters to the image may overlap with transfer of the plurality of slices of wavelet coefficients from the host unit to the graphical processing device.

According to other embodiments, a system for reconstructing magnetic resonance images includes a host unit and a graphical processing device. The host unit is configured to receive a plurality of coil data sets from a magnetic resonance imaging system, with each respective coil data set comprising scanner data and a coil sensitivity map associated with a distinct coil included in the magnetic resonance imaging system. The graphical processing device is configured to apply an iterative compressed-sensing reconstruction process to reconstruct an image based on the plurality of coil data sets. Each iteration of the iterative compressed-sensing reconstruction process may include asynchronously receiving the plurality of coil data sets from the host unit; executing a plurality of first processing kernels configured to optimize data fidelity values based on a respective coil data set included in the plurality of coil data sets, wherein a portion of the plurality of first processing kernels are executed while receiving a portion of the plurality of coil data sets from the host unit, and executing one or more second processing kernels configured to reconstruct the image on the graphical processing device based the data fidelity values calculated by each first processing kernel, wherein reconstruction is regularized by application of an $l_1$ norm of a wavelet transform to the image. In some embodiments, the one or more second processing kernels executed by the graphical processing device are configured to minimize the $l_1$ norm of the wavelet transform using a primal-dual algorithm.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at improving the memory efficiency of parallel MRI reconstruction using compressed sensing techniques in combination with a parallel computing platform and programming model such as the NVIDIA™ Compute Unified Device Architecture (CUDA). As is understood in the art, parallel computing platforms generally comprise a host unit and a graphical processing device. Parallel program models use the host as the primary storage system, while the device handles various processing tasks. The techniques described herein include three algorithmic improvements and one implementation optimization that reduce the memory consumption during reconstruction. First, coil sensitivity data is streamed between the host unit and the graphical processing device sequentially rather than transferring the entire coil data set at once. This allows pipeline processing to be used to process coil sensitivity data on the graphical processing device while other coil sensitivity data is being transferred from the host unit. In some embodiments, where wavelet transforms are used during reconstruction, a similar pipelining may be performed during the transform to use only one slice of wavelet coefficients at a time. Second, to enforce sparsity, is a primal/dual algorithm (e.g., a Chambolle-Pock algorithm) is used, so that most of the computations are performed in the image domain rather than the wavelet domain. Third, a pre-computed estimation of the Lipschitz constant is used during reconstruction to ensure convergence. These improvements may each be used alone or in combination to reduce the overall memory required to perform reconstruction. In turn, this allows reconstruction to be performed on graphical processing units, which reduces the overall time required to reconstruct an image. The techniques described herein may generally be applied to reconstruction of any image data; however they are especially applicable to three- and four-dimensional data sets where reconstruction on graphical processing units has been traditionally unavailable due to memory constraints.

Figure 1:
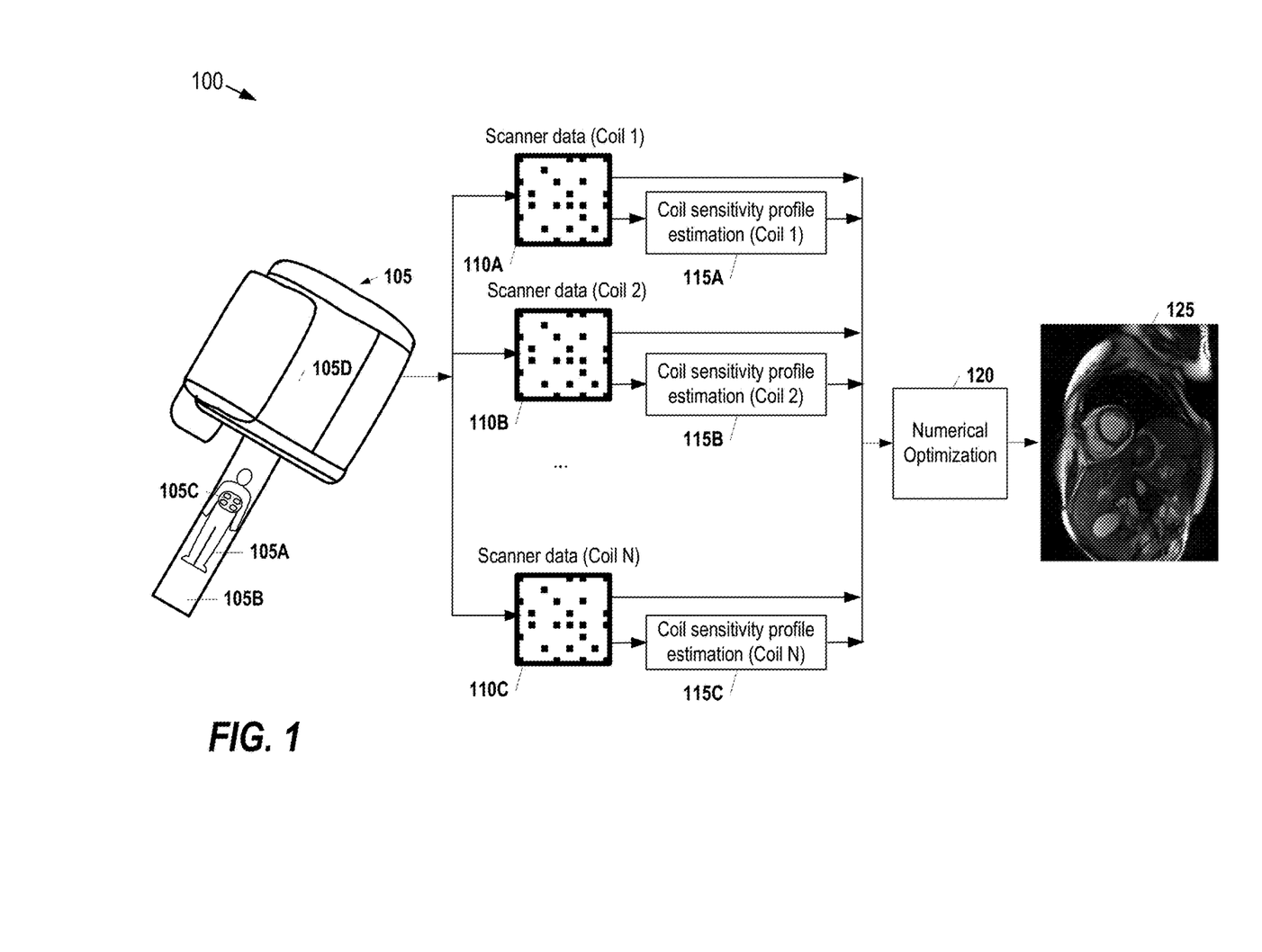
FIG. 1 provides a high-level illustration of an iterative reconstruction framework 100, according to some embodiments.

FIG. 1 provides a high-level illustration of an iterative reconstruction framework 100, according to some embodiments. Briefly, this framework shows how data is collected and processed using a Magnetic Resonance Imaging (MRI) Scanner 105 using compressed sensing techniques. As is understood in the art, compressed sensing techniques are used to minimize the data required for reconstruction and, thus, acquire data at a speed that is much faster than other scanning techniques. Compressed Sensing uses various nonuniform and pseudo-random sampling schemes to gather incoherent measurements which may be used to reconstruct images using an iterative reconstruction process which applies a numerical optimization procedure to a cost function.

The Patient 105A is positioned on the Scanner Table 105B of the MRI Scanner 105. Measurement Devices 105C (e.g., electrocardiogram electrodes, acquisition coils, etc.) are positioned on the Patient 105A over the region of interest (i.e., the region being scanned). Following that, the region of interest on the body landmarked and the Scanner Table 105B is sent into the Bore 105D of the MRI Scanner 105. Each coil included in the MRI Scanner 105 acquires data which is represented in FIG. 1 as Scanner Data 110A, 110B, and 110C. The data generated by the MRI Scanner 105 includes a coil sensitivity profile estimation (also referred to herein as a "map") of a respective coil. These estimations are represented in FIG. 1 by items 115A, 115B, and 115C.

Once the MRI Scanner 105 acquires the data, a Numerical Optimization Procedure 120 reconstructs the Scanner Data (110A, 110B, 110C, etc.) into an image 125. Briefly, an initial image is generated using the Scanner Data (110A, 110B, 110C, etc.). This initial image is used as an estimate for a numerical optimization procedure which iteratively updates the estimate to result in the final image 125. The Numerical Optimization Procedure 120 includes a cost function and an iterative compressed-sensing reconstruction process for minimizing the function based on the estimate provided by the initial image.

The cost function used by the Numerical Optimization Procedure 120 applies a signal model which enforces consistency with the measured data using mathematical modeling of the MRI signal. The cost function also typically includes one or more penalty terms which enforce consistency with prior knowledge such as the sparsity in transform basis. Various cost functions may be employed. For example, in some embodiments, the cost function applied by the numerical optimization procedure 120 is the following:

$$\hat{f} = \underset{f}{\operatorname{argmin}} \frac{1}{2} \sum_{n_c=1}^{N_c} \|G_{n_c} - F_u(s_{n_c} \odot f)\|_2^2 + \lambda \|\Lambda \odot (Wf)\|_1 \qquad (1)$$

In Equation 1, f is a one-dimensional vector which is the vectorized version of the signal to be reconstructed (e.g., an image). The vector f may be generated, for example, by concatenating columns of the signal together vertically. For dynamic imaging, the signal to be reconstructed is three-dimensional if the data is a time sequence of two-dimensional images, or four dimensional if the data is a time sequence of three-dimensional images. $N_c$ is the number of coils used by the MR device. $F_u$ is an under-determined Fourier transform operator. $G_{n_c}$ is the measured data for a particular coil, while $s_{n_c}$ is the coil sensitivity profile for a particular coil. In Equation 1, $\lambda \|\Lambda \odot (Wf)\|_1$ is a regularization term which provides a measure of how consistent the solution is with the private knowledge. The regularization term is the $l_1$-norm of the signal in the transform domain, where W represents wavelet transform (e.g., the redundant Haar), A is a regularization weighting factor, and X is a regularization parameter governing the tradeoff between the data fidelity and its sparsity.

Various iterative compressed-sensing reconstruction processes may be used to solve the cost function shown in Equation 1. For example, in some embodiments, the Fast Iterative Shrinkage Thresholding Algorithm (FISTA) is used. The FISTA algorithm may conceptually be understood as including two phases. First, during the initialization phase, the rate of convergence of the algorithm is determined by determining a gradient value $\nabla$. The gradient $\nabla_k$ of the k-th iteration is defined by a measurement operator M and its conjugate transpose $M^H$ and may be derived as follows:

$$\nabla_k = M^H(M\tilde{f}_k - G) \qquad (2)$$

The operators used in Equation 2 are defined as:

$$Mf = [F_u(s_n \otimes f)]_{1 \le n \le N} \qquad (3)$$

$$M^H G = \sum_{n=1}^{N} conj(s_n) \otimes (F_u^H G_n) \qquad (4)$$

Once the gradient $\nabla_k$ has been derived, during the second phase of FISTA, the image estimate f is updated according to the following set of equations:

$$f_{k+1} = prox_{\frac{\lambda}{L}}\left(\tilde{f}_k - \frac{1}{L}\nabla_k\right) \qquad (5)$$

$$t_{k+1} = \frac{1 + \sqrt{1 + 4t_k^2}}{2} \qquad (6)$$

$$\tilde{f}_{k+1} = f_k + \frac{t_k - 1}{t_{k+1}}(f_k - f_{k-1}) \qquad (7)$$

In Equation 5, an iterative shrinkage operator $prox_{\lambda/L}(\bullet)$ is applied to $\tilde{f}_k$ minus the product of the step size 1/L and the gradient $\nabla_k$. As shown in Equation 7, $\tilde{f}_k$ is a linear combination of the two previous data points $f_{k-1}$ and $f_k$. L is the Lipschitz constant of $M^H M$ (leading eigenvalue).

Figure 2:
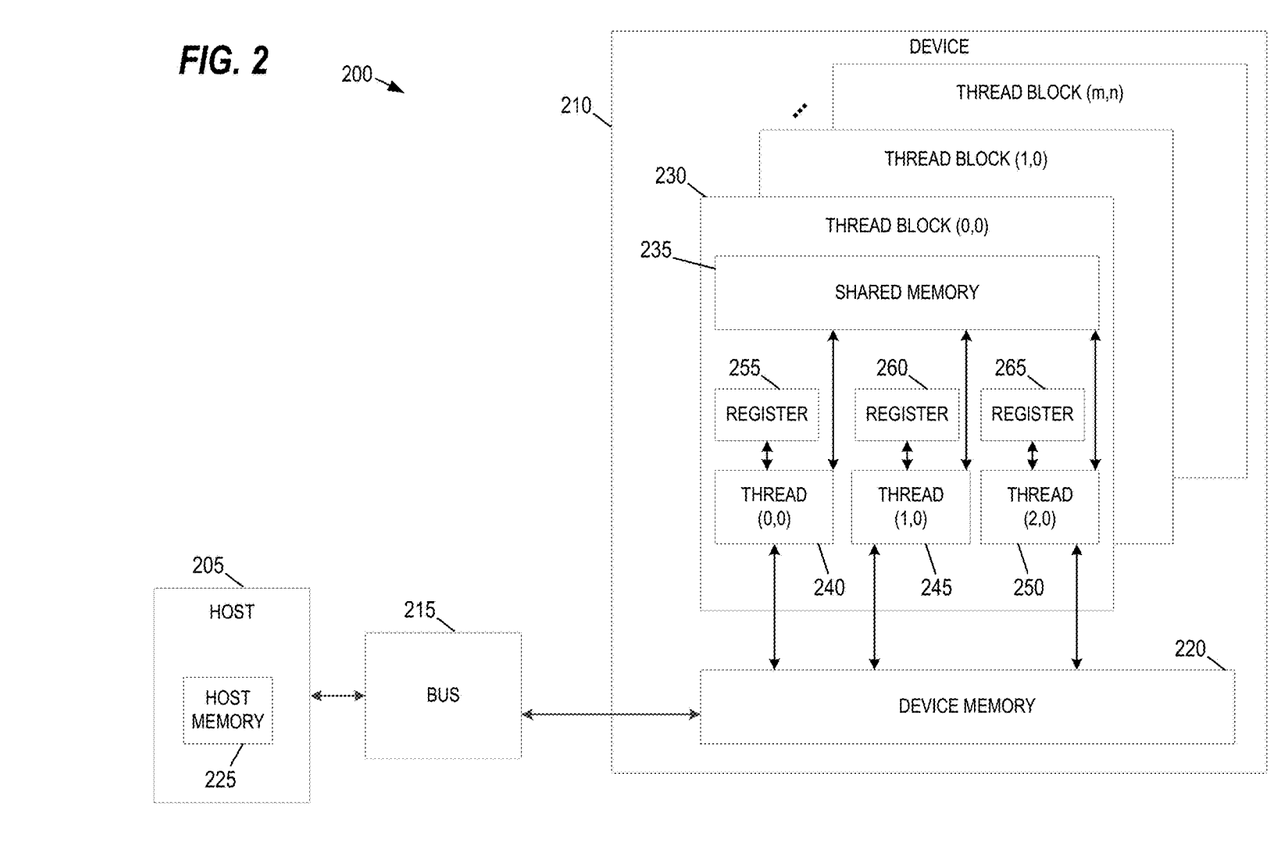
FIG. 2 provides an illustration of the parallel processing platform 200 that may be utilized to implement a numerical optimization procedure (see FIG. 1) and solve the cost function (see, e.g., Equation 1), according to some embodiments.

FIG. 2 provides an illustration of the parallel processing platform 200 that may be utilized to implement a numerical optimization procedure (see FIG. 1) and solve the cost function (see, e.g., Equation 1), according to some embodiments. This platform 200 may be used, for example, for implementations of the present invention where NVIDIA™ CUDA (or a similar parallel computing platform) is used. The architecture illustrated in FIG. 2 includes a host computing unit ("host") 205 and a GPU device ("device") 210 connected via a bus 215 (e.g., a PCIe bus). The host 205 includes the CPU (not shown in FIG. 2) and host memory 225 accessible to the CPU. The graphical processing device 210 includes the GPU and its associated memory 220, referred to herein as device memory. The graphical processing device memory 220 may include various types of memory, each optimized for different memory usages. For example, in some embodiments, the graphical processing device memory includes global memory, constant memory, and texture memory. Parallel portions of an application may be executed on the platform 200 as "device kernels" or simply "kernels." A kernel comprises parameterized code configured to perform a particular function. The parallel computing platform is configured to execute these kernels in an optimal manner across the platform 200 based on parameters, settings, and other selections provided by the user. Additionally, in some embodiments, the parallel computing platform may include additional functionality to allow for automatic processing of kernels in an optimal manner with minimal input provided by the user.

The processing required for each kernel is performed by grid of thread blocks (described in greater detail below). Using concurrent kernel execution, streams, and synchronization with lightweight events, the platform 200 of FIG. 2 (or similar architectures) may be used to parallelize various operations involved with image reconstruction. For example, as explained in greater detail below, in some embodiments, scanner data is asynchronously transferred from the host 205 to the device 210. During this asynchronous transfer, kernels may be launched on the device 210 to process the scanner data as it is transferred using a pipelining technique. Additionally scanner data associated with multiple coils may be processed in parallel using a plurality of kernels concurrently executing on the device 210.

The graphical processing device 210 includes one or more thread blocks 230 which represent the computation unit of the graphical processing device. The term thread block refers to a group of threads that can cooperate via shared memory and synchronize their execution to coordinate memory accesses. For example, in FIG. 2, threads 240, 245 and 250 operate in thread block 230 and access shared memory 235. Depending on the parallel computing platform used, thread blocks may be organized in a grid structure. A computation or series of computations may then be mapped onto this grid. For example, in embodiments utilizing CUDA, computations may be mapped on one-, two-, or three-dimensional grids. Each grid contains multiple thread blocks, and each thread block contains multiple threads. For example, in FIG. 2, the thread blocks 230 are organized in a two dimensional grid structure with m+1 rows and n+1 columns. Generally, threads in different thread blocks of the same grid cannot communicate or synchronize with each other. However, thread blocks in the same grid can run on the same multiprocessor within the GPU at the same time. The number of threads in each thread block may be limited by hardware or software constraints.

Continuing with reference to FIG. 2, registers 255, 260, and 265 represent the fast memory available to thread block 230. Each register is only accessible by a single thread. Thus, for example, register 255 may only be accessed by thread 240. Conversely, shared memory is allocated per thread block, so all threads in the block have access to the same shared memory. Thus, shared memory 235 is designed to be accessed, in parallel, by each thread 240, 245, and 250 in thread block 230. Threads can access data in shared memory 235 loaded from device memory 220 by other threads within the same thread block (e.g., thread block 230). The graphical processing device memory 220 is accessed by all blocks of the grid and may be implemented using, for example, Dynamic Random-Access Memory (DRAM).

Each thread can have one or more levels of memory access. For example, in the platform 200 of FIG. 2, each thread may have three levels of memory access. First, each thread 240, 245, 250, can read and write to its corresponding registers 255, 260, and 265. Registers provide the fastest memory access to threads because there are no synchronization issues and the register is generally located close to a multiprocessor executing the thread. Second, each thread 240, 245, 250 in thread block 230, may read and write data to the shared memory 235 corresponding to that block 230. Generally, the time required for a thread to access shared memory exceeds that of register access due to the need to synchronize access among all the threads in the thread block. However, like the registers in the thread block, the shared memory is typically located close to the multiprocessor executing the threads. The third level of memory access allows all threads on the graphical processing device 210 to read and/or write to the graphical processing device memory. Device memory requires the longest time to access because access must be synchronized across the thread blocks operating on the graphical processing device. Thus, in some embodiments, the calculation of the of the numerical optimization procedure used during image reconstruction may be coded such that it primarily utilizes registers and shared memory, and only utilizes device memory as necessary to move data in and out of a thread block.

In some embodiments, asynchronous streaming functionality of the parallel processing platform (e.g., the CUDA streaming API) is utilized to store the coil sensitivity map on the main memory and stream it to the GPU one coil at a timed during execution of the iterative compressed-sensing reconstruction process. Briefly, a stream is a sequence of commands (possibly issued by different host threads) that execute on the graphical processing device in the order in which they are issued by the host code. The transfer of data over streams can be synchronous or asynchronous in nature. For synchronous data transfers, the thread transferring the data on the host blocks until the data has been transferred. This may minimize the effect of parallelism since operations on the host must wait for the transfer. However, with asynchronous transfers, the host can fill the stream with individual data items without blocking. Then, the device processes each data item in the stream as resources become available, while allowing the host to concurrently process other operations.

Figure 3:
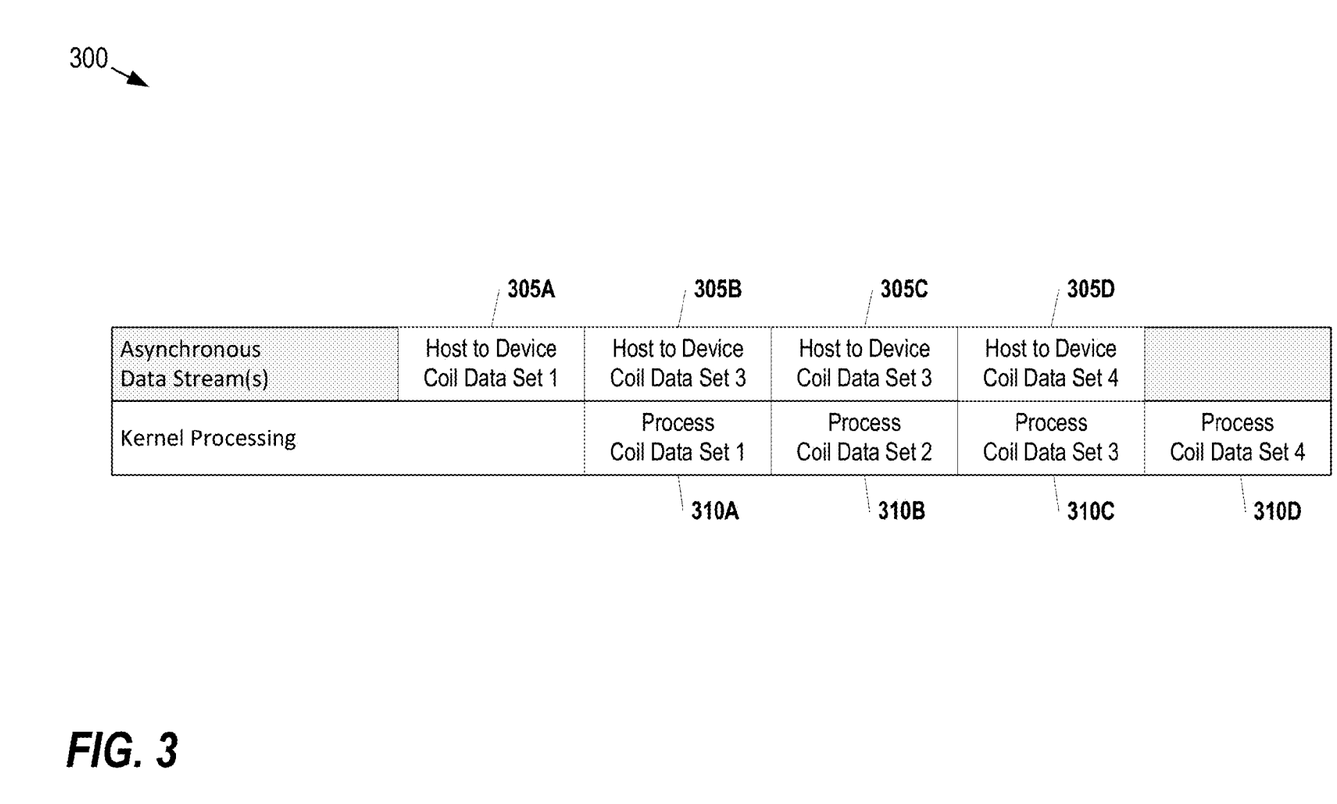
FIG. 3 provides an example pipelining scheme 300, as may be implemented in some embodiments.

FIG. 3 provides an example pipelining scheme 300, as may be implemented in some embodiments. This example shows transfer and processing of four coil data sets; however it should be understood that the general principle illustrated in the example may be extended to any number of coil data sets. One or more asynchronous data streams are used to perform a transfer 305A of data corresponding to the first coil data set. Similar data transfers 305B, 305C, and 305D are performed for the other coil data sets. Each transfer moves a respective data set from memory on the host unit to the memory on the graphical processing device. Concurrent with these transfers, processing is performed on the graphical processing device. In the example of FIG. 3, the coil data set corresponding to the first coil is processed at 310A while the host-to-device data transfer 305B is being performed. Similarly, the data sets for the second and third coils are processed at 310B and 310C, respectively, while the host-to-device data transfers for the third and fourth coils occur at 305B and 305C, respectively. The coil data set for the fourth coil is processed at 310D.

The core data core data fitting operations performed image reconstruction are applying the measurement operator and its adjoint (Equations 3 and 4, respectively). The forward operator is a concatenation over the coils, while the adjoint is a sum over the coils. Both cases follow a simple map/reduce pattern, so each coil can be processed separately. Using streaming, the whole coil sensitivity may be stored in the main memory at the host unit, and portions of the map corresponding to individual coils may be loaded into graphical processing device memory, as required, to perform computations. Thus, a pipelining technique may be employed which allows the graphical processing device to begin processing data from individual coils while data from other coils is still being transferred. Depending on the size of the coil sensitivity map, this may save up to 4.4 GB of GPU memory. In some embodiments, the technique may be further extended to the calculation of the regularization term during the numerical optimization procedure. For example, in one embodiment, during the wavelet transform performed during regularization, each slice of wavelet coefficients is streamed to and processed sequentially by the graphical processing device.

Depending on the implementation of the parallel processing platform, various techniques may be used for performing asynchronous operations with streams. For example in CUDA, the function cudaMemcpyAsync( ) performs a memory copy (either from host to device, or vice-versa) and is non-blocking on the host, so control returns to the host thread immediately after the transfer is issued. Similarly, the functions cudaMemcpy2DAsync( ) and cudaMemcpy3DAsync( ) can transfer 2D and 3D array sections, respectively, asynchronously in specified streams between the host and device (or vice-versa).

In some embodiments, the numerical optimization procedure performed during image reconstruction is designed to minimize the number of wavelet variables used while enforcing sparsity to reduce the memory required to perform the reconstruction. For example reconstruction may be regularized by the $l_1$ norm of the redundant Haar wavelet transform of the reconstructed image. Because of the redundancy, the size of the wavelet coefficients is double the size of the image in each dimension, so 8 times larger for the 3D case. In conventional systems, the Dykstra algorithm is used to enforce sparsity. Dykstra is a dual/dual algorithm, which means that all its computations are performed on the wavelet coefficients. In turn, this makes the calculations memory intensive. For example, using the convention implementation of the Dykstra loop, there are 4 wavelet variables which can require up to 10 GB of memory:

$$y = \text{prox}_{\lambda \|\cdot\|_1}(x+p); \quad (8)$$

$$p = p+x-y; \quad (9)$$

$$x = WW^H(y+q); \quad (10)$$

$$q = q+y-x; \quad (11)$$

To have good sparsity, the operator W must be redundant.

As an alternative to the Dykstra algorithm, in some embodiments, a primal/dual algorithm such as the Chambolle-Pock algorithm is used, so that most of the computations are performed on variables in the image domain. This reduces the processing requirements of 6 wavelet variables into image variables, for total memory savings of up to 7 GB. The Chambolle-Pock algorithm in particular also offers more flexibility in the model design since it allows the use of any linear operator as the sparsifying transform, not only tight frames as the Dykstra algorithm. Using a Chambolle-Pock loop, only the wavelet y and the image x is required:

$$y = \text{prox}_{(\lambda \|\cdot\|_1)} \cdot (y + \sigma Wx); \quad (12)$$

$$x = \frac{x + \tau(x_0 - W^H y)}{1 + \tau}; \quad (13)$$

The image variable x is 8 times smaller than the wavelets variables, resulting in a memory gain of 6.9 GB.

To ensure convergence of the reconstruction algorithm, one must know the Lipschitz constant of the measurement operator. In conventional system, this constant is estimated during the algorithm itself, which required storing intermediate values during the computation of the gradient. More specifically, with reference to Equation 5 in conventional systems L is estimated by line search. First, $f_{k+1}$ is computed for a given L. The value of L is reduced if the cost function does not decrease. Then, to avoid additional applications of M, the loop must be unfolded and values must be stored for $Mf_k$ and $Mf_{k-1}$. To reduce the overall memory requirements of reconstruction, the conventional technique is replaced in some embodiments with a pre-computed estimation of the Lipschitz constant such as the analytical upper bound for L (exact for the sampling patterns considered). This saves three intermediate variables of the size of the acquired measurements, for up to 2.2 GB total savings.

Figure 4:
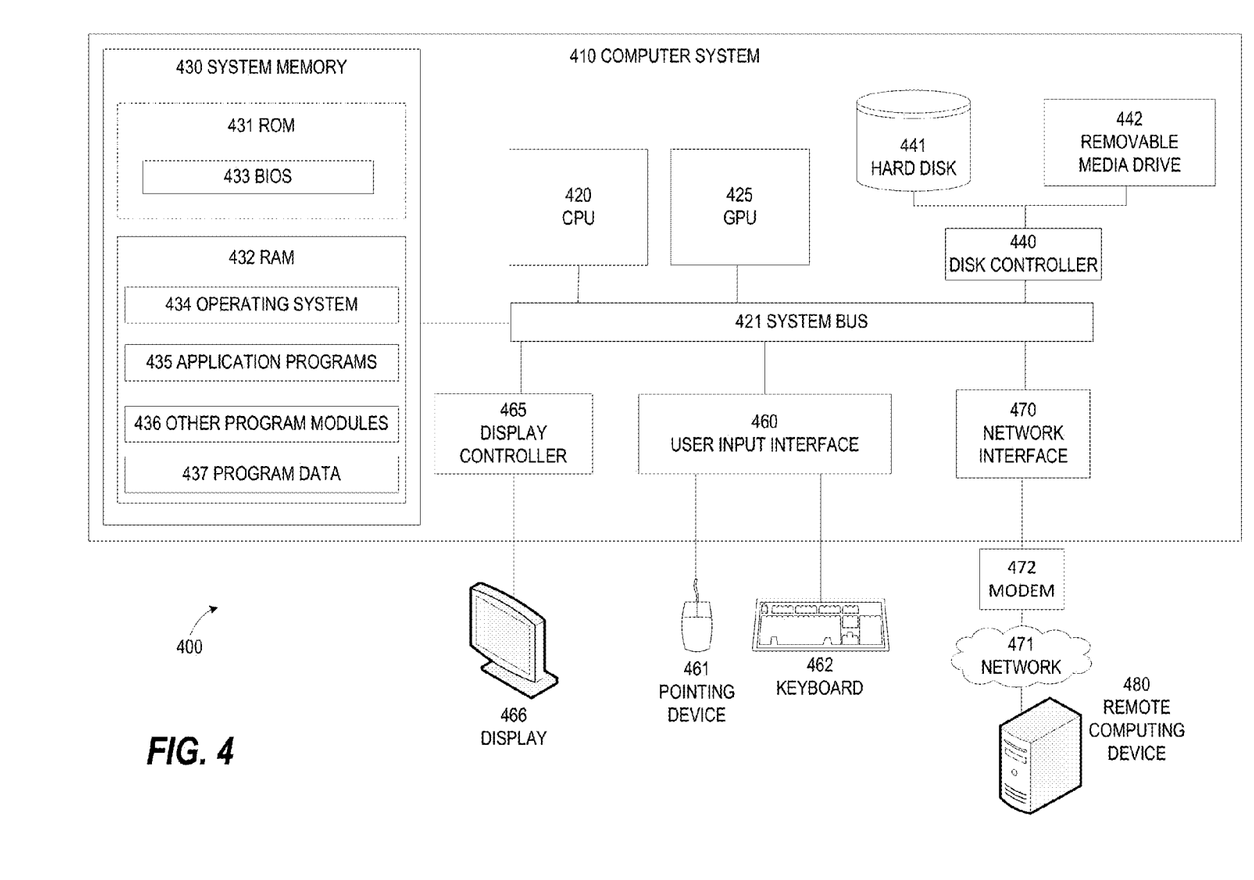
FIG. 4 illustrates an example of a computing environment 400 within which embodiments of the invention may be implemented.

FIG. 4 illustrates an example of a computing environment 400 within which embodiments may be implemented. Computing environment 400 may include computer system 410, which is one example of a computing system upon which embodiments of the invention may be implemented. This computer system 410 may be used alone, or in combination with other computer systems, to implement a parallel computing platform such as illustrated in FIG. 2.

As shown in FIG. 4, the computer system 410 may include a communication mechanism such as a bus 421 or other communication mechanism for communicating information within the computer system 410. The computer system 410 further includes one or more CPUS 420 and one or more GPUs 425 (collectively the "processors") coupled with the bus 421 for processing the information.

The computer system 410 includes a system memory 430 coupled to the bus 421 for storing information and instructions to be executed by processors. The system memory 430 may include computer readable storage media in the form of volatile and/or nonvolatile memory, such as read only memory (ROM) 431 and/or random access memory (RAM) 432. The system memory RAM 432 may include other dynamic storage device(s) (e.g., dynamic RAM, static RAM, and synchronous DRAM). The system memory ROM 431 may include other static storage device(s) (e.g., programmable ROM, erasable PROM, and electrically erasable PROM). In addition, the system memory 430 may be used for storing temporary variables or other intermediate information during the execution of instructions by the processors. A basic input/output system 433 (BIOS) containing the basic routines that help to transfer information between elements within computer system 410, such as during start-up, may be stored in ROM 431. RAM 432 may contain data and/or program modules that are immediately accessible to and/or presently being operated on by the processors. System memory 430 may additionally include, for example, operating system 434, application programs 435, other program modules 436 and program data 437.

In addition to the System Memory 430, the GPU 425 has access to memory (not shown in FIG. 4) which is dedicated to GPU processing. This memory may include, for example, video memory, one or more data caches, and one or more registers. Various limitations on memory access may be imposed by the parallel computing platform used to operate the GPU 425 to permit concurrent execution.

The computer system 410 also includes a disk controller 440 coupled to the bus 421 to control one or more storage devices for storing information and instructions, such as a magnetic hard disk 441 and a removable media drive 442 (e.g., floppy disk drive, compact disc drive, tape drive, and/or solid state drive). The storage devices may be added to the computer system 410 using an appropriate device interface (e.g., a small computer system interface (SCSI), integrated device electronics (IDE), Universal Serial Bus (USB), or FireWire).

The computer system 410 may also include a display controller 465 coupled to the bus 421 to control a monitor or display 466, such as a cathode ray tube (CRT) or liquid crystal display (LCD), for displaying information to a computer user. The computer system includes an input interface 460 and one or more input devices, such as a keyboard 462 and a pointing device 461, for interacting with a computer user and providing information to the processor. The pointing device 461, for example, may be a mouse, a trackball, or a pointing stick for communicating direction information and command selections to the processors and for controlling cursor movement on the display 466. The display 466 may provide a touch screen interface which allows input to supplement or replace the communication of direction information and command selections by the pointing device 461.

The computer system 410 may perform a portion or all of the processing steps of embodiments of the invention in response to the processors executing one or more sequences of one or more instructions contained in a memory, such as the system memory 430. Such instructions may be read into the system memory 430 from another computer readable medium, such as a hard disk 441 or a removable media drive 442. The hard disk 441 may contain one or more datastores and data files used by embodiments of the present invention. Datastore contents and data files may be encrypted to improve security. The processors may also be employed in a multi-processing arrangement to execute the one or more sequences of instructions contained in system memory 430. In alternative embodiments, hard-wired circuitry may be used in place of or in combination with software instructions. Thus, embodiments are not limited to any specific combination of hardware circuitry and software.

As stated above, the computer system 410 may include at least one computer readable medium or memory for holding instructions programmed according embodiments of the invention and for containing data structures, tables, records, or other data described herein. The term "computer readable medium" as used herein refers to any medium that participates in providing instructions to the processor for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 441 or removable media drive 442. Non-limiting examples of volatile media include dynamic memory, such as system memory 430. Non-limiting examples of transmission media include coaxial cables, copper wire, and fiber optics, including the wires that make up the bus 421. Transmission media may also take the form of acoustic or light waves, such as those generated during radio wave and infrared data communications.

The computing environment 400 may further include the computer system 410 operating in a networked environment using logical connections to one or more remote computers, such as remote computing device 480. Remote computing device 480 may be a personal computer (laptop or desktop), a mobile device, a server, a router, a network PC, a peer device or other common network node, and typically includes many or all of the elements described above relative to computer system 410. When used in a networking environment, computer system 410 may include modem 472 for establishing communications over a network 471, such as the Internet. Modem 472 may be connected to bus 421 via user network interface 470, or via another appropriate mechanism.

Network 471 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 410 and other computers (e.g., remote computing device 480). The network 471 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 471.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A computer-implemented method for reconstructing magnetic resonance images using a parallel computing platform comprising a host unit and a graphical processing device, the method comprising:
    receiving a plurality of coil data sets from a magnetic resonance imaging system, each respective coil data set comprising scanner data and a coil sensitivity map associated with a distinct coil included in the magnetic resonance imaging system;
    applying an iterative compressed-sensing reconstruction process to reconstruct an image based on the plurality of coil data sets, wherein each iteration of the iterative compressed-sensing reconstruction process comprises:
        individually transferring the plurality of coil data sets from the host unit to the graphical processing device using a plurality of asynchronous data streams,
        overlapping with transfer of the plurality of coil data sets, optimizing a plurality of data fidelity values on the graphical processing device, each respective data fidelity value corresponding to a distinct coil data set, and
        computing an estimated image on the graphical processing device based on the plurality of data fidelity values.

2. The method of claim 1, wherein the iterative compressed-sensing reconstruction process is regularized by an $l_1$ norm of a sparsifying transform applied to the estimated image.

3. The method of claim 2, wherein calculation of the $l_1$ norm of the sparsifying transform applied to the estimated image is performed using a single wavelet as the sparsifying transform.

4. The method of claim 2, wherein a Chambolle-Pock loop is used to minimize the $l_1$ norm of the sparsifying transform applied to the estimated image.

5. The method of claim 2, wherein the sparsifying transform is a redundant Haar wavelet transform.

6. The method of claim 3, wherein the wavelet transform is computed by applying a plurality of slices of wavelet filters to the estimated image and each respective slice of resulting wavelet coefficients is individually transferred from the host unit to the graphical processing device during application of the sparsifying transform using a plurality of additional asynchronous data streams.

7. The method of claim 1, wherein a pre-computed estimation of a Lipschitz constant is used to ensure convergence of the iterative compressed-sensing reconstruction process.

8. The method of claim 7, wherein the pre-computed estimation of the Lipschitz constant is an analytical upper bound for the Lipschitz constant determined based on one or more sampling patterns.

9. The method of claim 1, wherein each of the plurality of data fidelity values is computed using a distinct processing kernel executing on the graphical processing device.

10. A computer-implemented method for reconstructing images based on magnetic resonance imaging data using a parallel computing platform comprising a host unit and a graphical processing device, the method comprising:
receiving a plurality of coil data sets from a magnetic resonance imaging system, each respective coil data set comprising scanner data and a coil sensitivity map associated with a distinct coil included in the magnetic resonance imaging system;
storing the plurality of coil data sets at the host unit;
applying an iterative compressed-sensing reconstruction process to reconstruct an image based on the plurality of coil data sets, wherein each iteration of the iterative compressed-sensing reconstruction process comprises:
individually transferring the plurality of coil data sets from the host unit to the graphical processing device using a plurality of asynchronous data streams,
launching a plurality of first processing kernels on the graphical processing device, each respective processing kernel configured to a optimize data fidelity values based on a respective coil data set included in the plurality of coil data sets, and
launching a second processing kernel on the graphical processing device configured to reconstruct the image on the graphical processing device based the data fidelity values calculated by each first processing kernel, wherein reconstruction is regularized by application of an $l_1$ norm of a wavelet transform to the image.

11. The method of claim 10, wherein minimization of the $l_1$ norm of the wavelet transform is performed using a primal-dual algorithm.

12. The method of claim 11, wherein the primal-dual algorithm is comprises a loop of Chambolle-Pock operations.

13. The method of claim 10, wherein the wavelet transform is a redundant Haar wavelet transform.

14. The method of claim 13, wherein the redundant Haar wavelet transform is computed by applying a plurality of slices of wavelet filters to the image.

15. The method of claim 14, further comprising:
individually transferring each respective slice of wavelet coefficients from the host unit to the graphical processing device during minimization of the $l_1$ norm of the wavelet transform using a plurality of additional asynchronous data streams.

16. The method of claim 15, wherein application of the plurality of slices of wavelet filters to the image overlaps with transfer of the plurality of slices of wavelet coefficients from the host unit to the graphical processing device.

17. The method of claim 10, wherein a pre-computed estimation of a Lipschitz constant is used to ensure convergence of the iterative compressed-sensing reconstruction process.

18. The method of claim 17, wherein the pre-computed estimation of the Lipschitz constant is an analytical upper bound for the Lipschitz constant determined based on one or more sampling patterns.

19. A system for reconstructing magnetic resonance images, the system comprising:
a host unit configured to receive a plurality of coil data sets from a magnetic resonance imaging system, each respective coil data set comprising scanner data and a coil sensitivity map associated with a distinct coil included in the magnetic resonance imaging system, and
a graphical processing device configured to apply an iterative compressed-sensing reconstruction process to reconstruct an image based on the plurality of coil data sets, wherein each iteration of the iterative compressed-sensing reconstruction process comprises:
asynchronously receiving the plurality of coil data sets from the host unit;
executing a plurality of first processing kernels configured to optimize data fidelity values based on a respective coil data set included in the plurality of coil data sets, wherein a portion of the plurality of first processing kernels are executed while receiving a portion of the plurality of coil data sets from the host unit, and
executing one or more second processing kernels configured to reconstruct the image on the graphical processing device based the data fidelity values calculated by each first processing kernel, wherein reconstruction is regularized by application of an $l_1$ norm of a wavelet transform to the image.

20. The system of claim 19, wherein the one or more second processing kernels executed by the graphical processing device are configured to minimize the $l_1$ norm of the wavelet transform using a primal-dual algorithm.

\* \* \* \* \*